US007012794B2

(12) United States Patent
Le

(10) Patent No.: US 7,012,794 B2
(45) Date of Patent: Mar. 14, 2006

(54) CMOS ANALOG SWITCH WITH AUTO OVER-VOLTAGE TURN-OFF

(75) Inventor: Hung Pham Le, San Jose, CA (US)

(73) Assignee: Exar Corporation, Fremont, CA (US)

( * ) Notice: Subject to any disclaimer, the term of this patent is extended or adjusted under 35 U.S.C. 154(b) by 282 days.

(21) Appl. No.: 10/346,964

(22) Filed: Jan. 17, 2003

(65) Prior Publication Data

US 2004/0141273 A1 Jul. 22, 2004

(51) Int. Cl.
*H02H 9/00* (2006.01)
(52) U.S. Cl. ....................... 361/91.1; 361/56
(58) Field of Classification Search .............. 361/56, 361/58, 90, 91.1, 91.5, 110, 111; 327/328, 327/391, 404, 537
See application file for complete search history.

(56) References Cited

U.S. PATENT DOCUMENTS

| 5,994,744 | A | * | 11/1999 | Katayama et al. | .......... 257/370 |
| 6,163,199 | A | * | 12/2000 | Miske et al. | ................. 327/434 |
| 6,617,890 | B1 | * | 9/2003 | Chen et al. | ................... 327/78 |
| 6,700,431 | B1 | * | 3/2004 | Fotouhi et al. | ............ 327/404 |
| 6,768,339 | B1 | * | 7/2004 | Von Thun et al. | ............ 326/81 |

\* cited by examiner

*Primary Examiner*—Brian Sircus
*Assistant Examiner*—Danny Nguyen
(74) *Attorney, Agent, or Firm*—Townsend and Townsend and Crew LLP

(57) ABSTRACT

An analog transfer gate that can be connected to an external line of a chip that is also connected to a digital circuit. The transfer gate includes both NMOS and PMOS transistors for passing the analog signals in both directions. A voltage sensing circuit is connected to the external line and is configured to sense a voltage that is higher than the supply voltage of the analog circuit. When this occurs, it produces a sense output signal. The sense output signal activates a protection enabling circuit that turns off the PMOS and NMOS transistors. In addition, at least one additional protection transistor is activated to avoid too high of a voltage being applied across any of the transistor junctions.

8 Claims, 4 Drawing Sheets

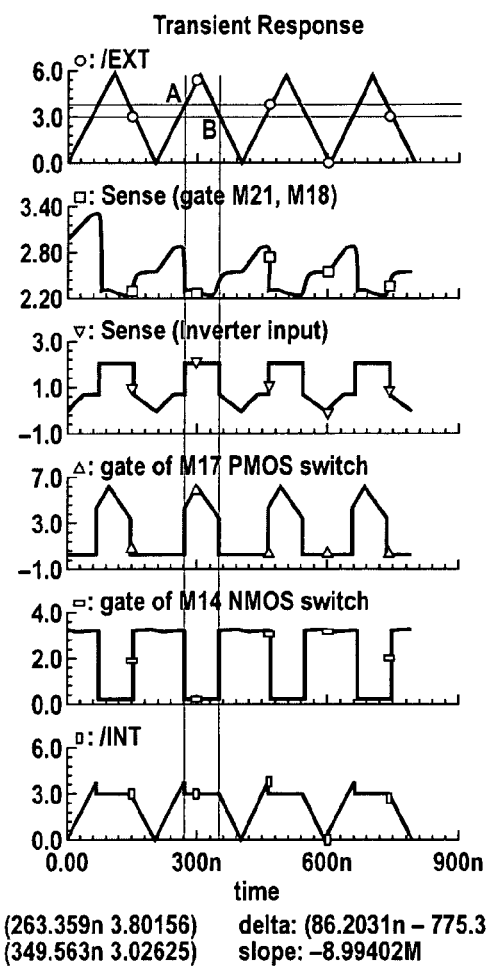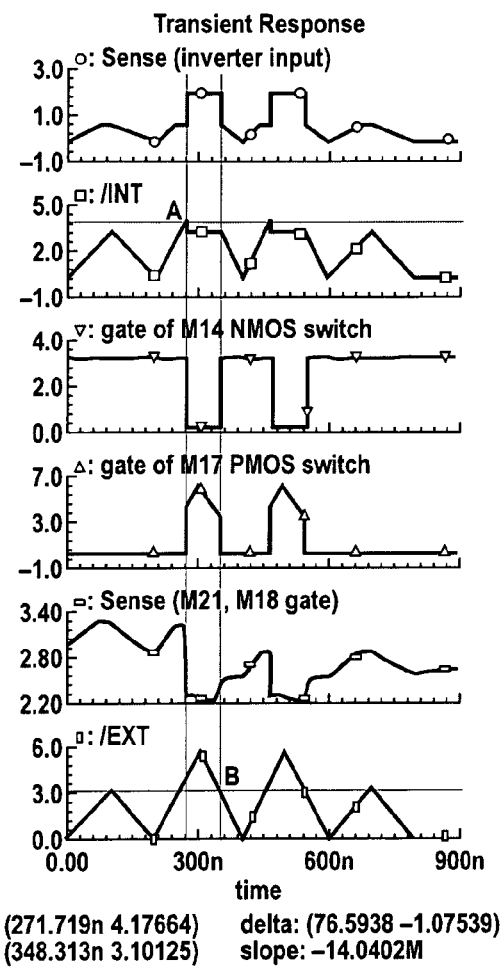
FIG. 4
FIG. 5

CMOS ANALOG SWITCH WITH AUTO OVER-VOLTAGE TURN-OFF

CROSS-REFERENCES TO RELATED APPLICATIONS NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates to I/O pins that connect to both digital and analog circuitry. In particular, it relates to an analog transfer gate with over-voltage protection.

Many types of protection circuits are used for the I/O pins of an integrated circuit. Many of these circuits deal with electrostatic discharge (ESD) protection. An example is U.S. Pat. No. 6,424,510. These circuits are designed to protect against very high voltages, typically in the form of a spike, which might be applied to a pin.

Another type of protection circuit is required for normal operation of a chip. In recent years, the voltage supply for chips has been reduced from 5 volts to 3.3 volts to 2.5 volts or lower. Accordingly, a particular chip does not know if it will be interfacing with a chip of the same voltage, or a higher voltage. For example, a 3.3 volt chip may receive a 5 volt digital signal. For digital signals, the input buffer can simply translate the 5 volt into a 3.3 volt or other level signal.

When an analog circuit is connected to the same pin as a digital circuit, the 5 volt signal which simply needs to be converted for the digital circuit can cause problems for the analog circuitry. For this reason, typically separate pins are used for analog and digital I/O signals. However, it would be desirable to be able to use the same pin for both analog and digital internal circuits, while providing over-voltage protection of the analog circuit from higher digital signals.

BRIEF SUMMARY OF THE INVENTION

The present invention provides an analog transfer gate that can be connected to an external line of a chip that is also connected to a digital circuit. The transfer gate includes both NMOS and PMOS transistors for passing the analog signals in both directions. A voltage sensing circuit is connected to the external line and is configured to sense a voltage that is higher than the supply voltage of the analog circuit. When this occurs, it produces a sense output signal. The sense output signal activates a protection enabling circuit that turns off the PMOS and NMOS transistors. In addition, at least one additional protection transistor is activated to avoid too high of a voltage being applied across any of the transistor junctions.

The invention thus provides an analog switch or transfer gate, which functions as an I/O circuit to automatically allow and pass analog signals less than or equal to the supply voltage from an external node, while blocking higher voltage signals to protect the analog circuitry. This is accomplished using CMOS transistors with minimal DC current consumption.

In one embodiment, the voltage sensing circuit draws virtually no current unless an over-voltage condition occurs. This is accomplished by using two interconnected PMOS sensing transistors that are activated when a high voltage compared to the supply voltage exceeds the threshold voltage of the gate-source junction of the transistor. Connected to this is a transistor circuit connected between the PMOS sensing transistors and ground. This acts as a resistance to provide a voltage level due to current flow to turn off the transfer gate transistors. In addition, a feedback circuit is connected between the transistor circuit and the PMOS sensing transistors to accelerate the turn-on time. Simulations show that a turn-on time of less than two nanoseconds can be achieved for an over-voltage signal with a rise time of one nanosecond.

For a further understanding of the nature and advantages of the invention, reference should be made to the following description taken in conjunction with accompanying drawings.

BRIEF DESCRIPTION OF THE DRAWINGS

FIGS. 4 and 5 are graphs illustrating the transient response of various transistors in the circuit of FIG. 1.

DETAILED DESCRIPTION OF THE INVENTION

Figure 1:
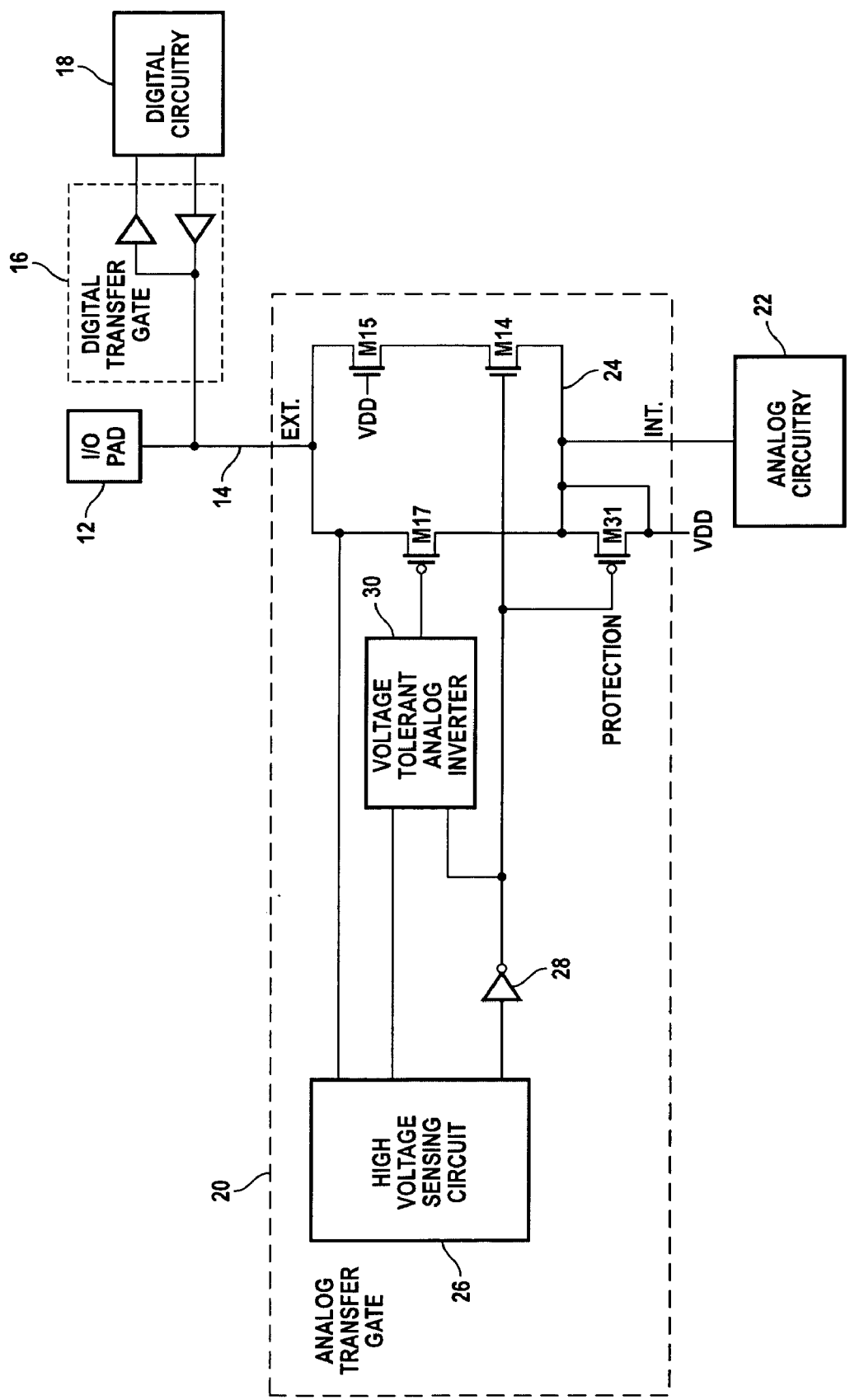
FIG. 1 is a block diagram of an I/O circuit including a digital transfer gate and an analog transfer gate according to an embodiment of the invention.

FIG. 1 shows an I/O pad 12 to which an external (EXT) line 14 is connected. A digital transfer gate 16 couples external line 14 to internal digital circuitry 18. An analog transfer gate 20 according to the present invention connects external line 14 to internal analog circuitry 22.

Analog transfer gate 20 has NMOS transistors M14 and M15 and PMOS transistor M17 to connect input and output signals between external line 14 and internal line 24 connected to internal analog circuitry 22. These are large transistors that can quickly pass the particular voltage levels back and forth.

A high voltage sensing circuit 26 determines when the voltage on external line 14 exceeds the internal supply voltage (VDD). When this occurs, the sensing circuit provides a signal to a digital inverter 28 that directly turns off NMOS transistor M14, and indirectly turns off PMOS transistor M17 through a voltage tolerant analog inverter 30. Extra transistors to avoid voltages in excess of the tolerable junction voltage being applied across the transistors are provided. For example, a NMOS transistor M15, with its gate connected to the supply voltage VDD, limits the voltage across NMOS transistor M14. Similarly, transistor M31 limits the voltage across PMOS transistor M17.

Figure 2:
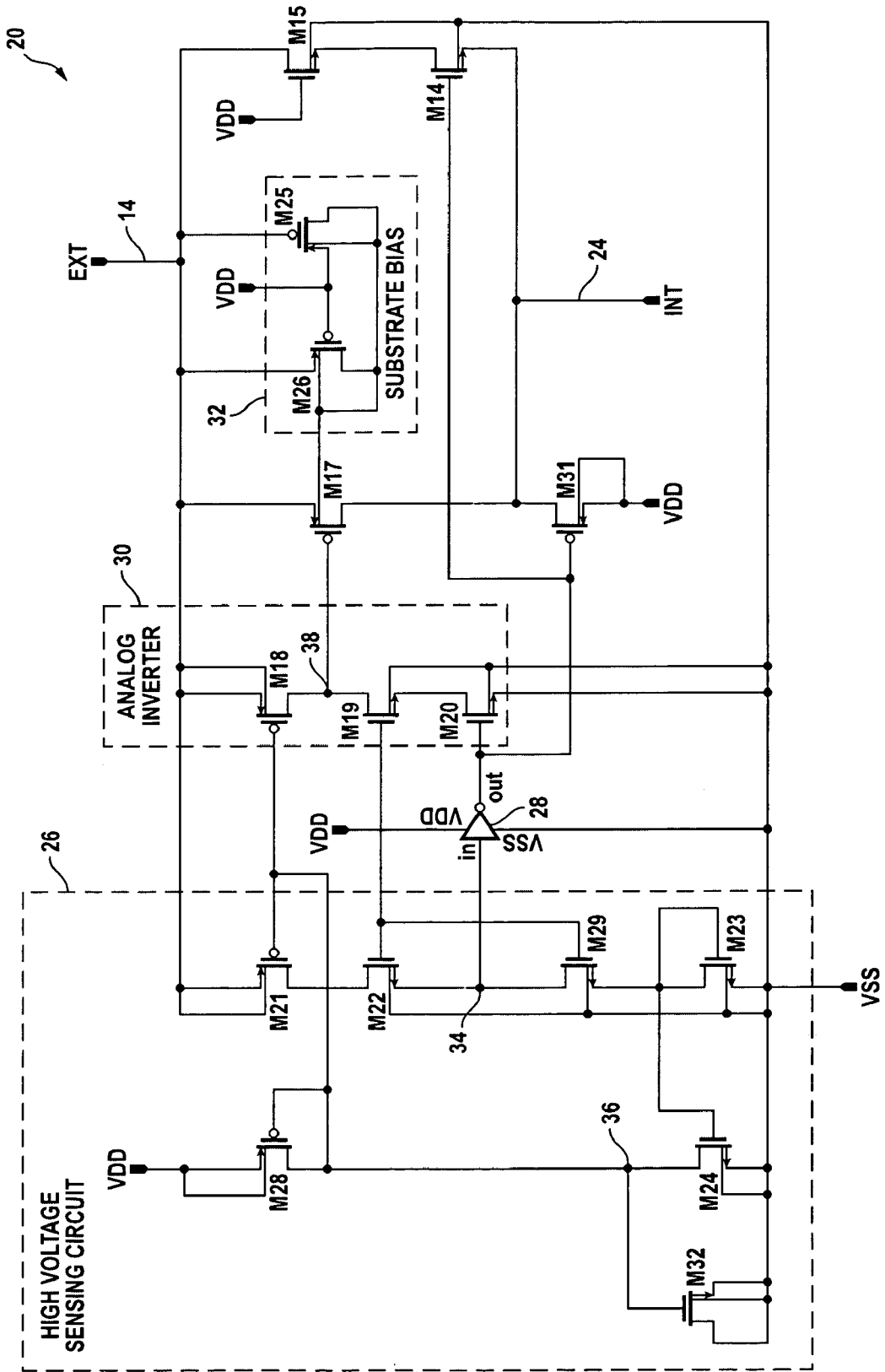
FIG. 2 is a circuit diagram of an embodiment of the analog transfer gate of FIG. 1.

FIG. 2 is a circuit diagram of the analog transfer gate 20 of FIG. 1. NMOS transistors M14 and M15 are large transistors, with a width of 50 u, a length of 350 u and m=3 in one embodiment. PMOS transistor M17 has a width of 100 u and length of 350 n with m=2.

A substrate bias circuit 32 connects to external line 14 in the supply voltage, VDD, to provide a bias voltage to the substrate of PMOS transistor M17.

Transistors M14, M15 and M17 provide effectively an approximately 100 ohm resistance between external line 14 and internal line 24.

High voltage sensing circuit 26 includes sensing transistors M21 and M28. These transistors have their gates connected together, with the so connected to the supply voltage, VDD. When the voltage on external line 14 is less than VDD, the output of sensing circuit 26, node 34, is a digital zero. When the voltage on external line 14 is above the supply voltage by more than the difference between the supply voltage and the gate-source threshold of transistor M21, the transistor M21 will turn on in conjunction with transistor M28. A slight current will be provided to transistor M22, which has its gate connected to VDD. This transistor serves to protect the transistors below, M23 and M29, from having too high a voltage across them. Transistor M29 is a small transistor, preferably having a width of 600 n and length of 3 u. Thus, it is more than 10,000 times smaller than transistors M14, M15 and M17. This transistor thus acts as a resistor, with the slight current being enough to make its voltage rise. This will turn on transistor M23, which is connected as a diode. Prior to being turned on, it is at the ground voltage, VSS, or 0 volts. When diode-connected transistor M23 turns on, its gate is connected to transistor M24, causing it to turn on and pulling more current from transistor M28, causing transistor M21 to switch more quickly. This increases the speed at which the high voltage is sensed and the speed at which protection circuits are activated. Transistor M32 acts as a capacitor to make sure node 36 is stable.

Upon the detection of a high voltage on the external line, node 34 will go high, causing a low output signal for digital converter 28. This low output signal directly turns off transistor M14 and enables protection transistor M31 to limit the voltage across transistor M17 when it is turned off.

Transistor M17 is turned off through an analog inverter 30. Analog inverter 30 includes transistor M19, which provides the high level signal to turn off transistor M17. The gate of transistor M19 is connected to the supply voltage, VDD. Normally, the high output level from inverter 28 keeps transistor M20 turned on, thus connecting the drain and source of transistor M19 to ground. However, when a high voltage level occurs, the output of inverter 28 goes low, turning off transistor M20. Node 38 is then pulled high by transistor M18, turning off transistor M17. Transistor M19 serves the function of protecting transistor M20, by limiting the voltage across it.

Figure 3:
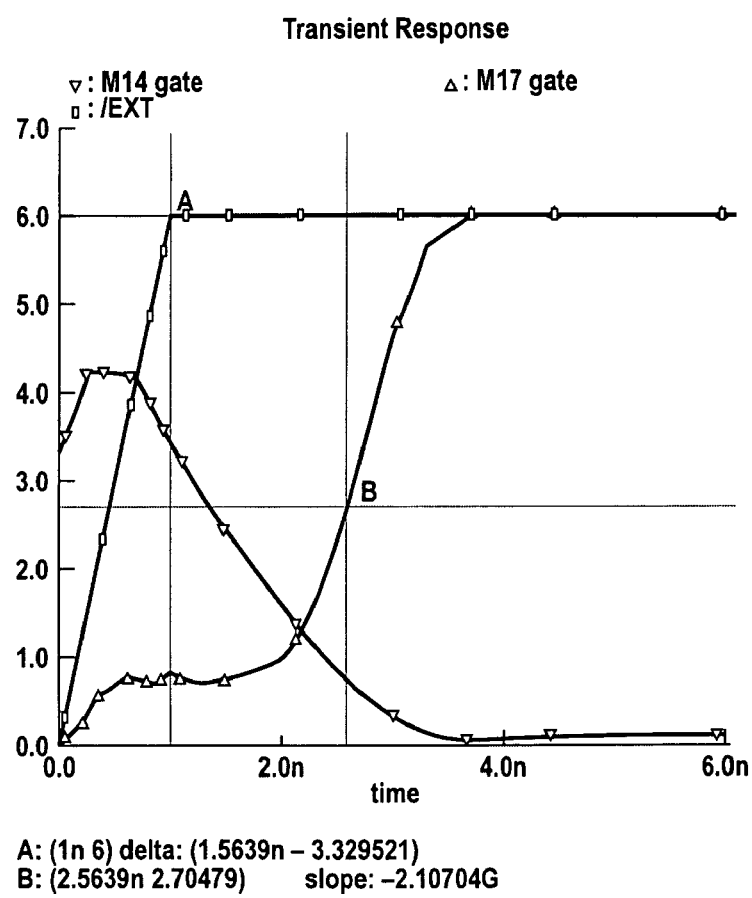
FIG. 3 is a graph illustrating the transient response switching time of the analog transfer gate of FIG. 2.

FIG. 3 is a graph illustrating the transient response of the gates of transistors M14 and M17 in response to the EXT signal (line 14) going from 0–6 volts. As can be seen, within two nanoseconds or less, the transistors are turned off. This provides a very quick response to protect the analog circuitry from high voltage levels.

FIGS. 4 and 5 illustrate the transient response of the external and internal lines (14 and 24), along with the inverter 28 input and the gates of transistors M14, M17, M21 and M18.

As will be understood by those of skill in the art, the present invention can be embodied in other specific forms without departing from the essential characteristics thereof. Accordingly, the foregoing description is intended to be illustrative, but not limiting, of the scope of invention, which is set forth in the following claims.

What is claimed is:

1. An analog transfer gate connected to an external line also connected to a digital circuit, comprising:
   a NMOS transfer transistor connected between said external line and an analog circuit;
   a PMOS transfer transistor connected between said external line and said analog circuit;
   at least one protection transistor connected to one of said NMOS and PMOS transfer transistors;
   a voltage sensing circuit connected to said external line and configured to sense a voltage higher than a supply voltage of said analog circuit and produce a sense output signal; and
   a protection enabling circuit, having an input coupled to said voltage sensing circuit and outputs connected to said PMOS and NMOS transfer transistors and said protection transistor, said protection enabling circuit being responsive to said sense output signal to turn off said PMOS and NMOS transfer transistors and activate said protection transistor, wherein said voltage sensing circuit comprises:
   first and second interconnected PMOS sensing transistors coupled to said external line and said supply voltage, respectively, said first transistor turning on when a voltage on said external line exceeds said supply voltage by more than a predetermined amount;
   a transistor circuit connected between said first PMOS sensing transistor and ground; and
   a feedback circuit connected between said transistor circuit and said first and second PMOS sensing transistors for accelerating the turn-on time of said first transistor.

2. The analog transfer gate of claim 1 further comprising:
   a protection transistor connected between said first PMOS transistor and said transistor circuit;
   wherein a connection between said protection circuit and said transistor circuit is an output of said voltage sensing circuit.

3. The analog transfer gate of claim 2 wherein said transistor circuit comprises:
   a diode connected transistor connected to ground; and
   a small transistor connected between said diode connected transistor and said protection transistor, said small transistor being at least 10,000 times smaller than said NMOS and PMOS transfer transistors.

4. The analog transfer gate of claim 1 wherein said protection enabling circuit comprises:
   a digital inverter having an input connected to an output of said voltage sensing circuit and an output connected to a gate of said NMOS transfer transistor; and
   an analog inverter connected between said output of said digital inverter and a gate of said PMOS transfer transistor.

5. The analog transfer gate of claim 4 wherein said analog inverter comprises:
   a first PMOS transistor having a source connected to said external line
   and a gate connected to a PMOS sensing transistor in said voltage sensing circuit;
   a first NMOS transistor having a drain connected to a drain of said first PMOS transistor and a gate connected to said supply voltage, said drains of said first NMOS and PMOS transistors being connected to said gate of said PMOS transfer transistor; and
   a second NMOS transistor connected between said first NMOS transistor and ground, and having a gate connected to said output of said digital inverter.

6. The analog transfer gate of claim 1 further comprising a substrate biasing circuit coupled to said external line and to said supply voltage to bias a substrate of said PMOS transfer transistor.

7. The analog transfer gate of claim 1 wherein said protection transistor comprises a PMOS protection transistor having a drain connected to a drain of said PMOS transfer transistor and a source connected to said supply voltage.

8. An analog transfer gate connected to an external line also connected to a digital circuit, comprising:
 a NMOS transfer transistor connected between said external line and an analog circuit;
 a PMOS transfer transistor connected between said external line and said analog circuit;
 at least one protection transistor connected to one of said NMOS and PMOS transfer transistors;
 a voltage sensing circuit connected to said external line and configured to sense a voltage higher than a supply voltage of said analog circuit and produce a sense output signal; and
 a protection enabling circuit, having an input coupled to said voltage sensing circuit and outputs connected to said PMOS and NMOS transfer transistors and said protection transistor, said protection enabling circuit being responsive to said sense output signal to turn off said PMOS and NMOS transfer transistors and activate said protection transistor,
wherein said voltage sensing circuit comprises:
 first and second interconnected PMOS sensing transistors coupled to said external line and said supply voltage, respectively, said first transistor turning on when a voltage on said external line exceeds said supply voltage by more than a predetermined amount;
 a transistor circuit connected between said first PMOS sensing transistor and ground; and
 a feedback circuit connected between said transistor circuit and said first and second PMOS sensing transistors for accelerating the turn-on time of said first transistor and
wherein said protection enabling circuit comprises:
 a digital inverter having an input connected to an output of said voltage sensing circuit and an output connected to a gate of said NMOS transfer transistor; and
 an analog inverter connected between said output of said digital inverter and a gate of said PMOS transfer transistor.

\* \* \* \* \*